United States Patent
Owaki et al.

(10) Patent No.: US 7,399,061 B2
(45) Date of Patent: Jul. 15, 2008

(54) BONDING STRUCTURE, ACTUATOR DEVICE AND LIQUID-JET HEAD

(75) Inventors: Hiroshige Owaki, Nagano-ken (JP); Yoshinao Miyata, Nagano-ken (JP)

(73) Assignee: Seiko Epson Corporation, Tokyo (JP)

(*) Notice: Subject to any disclaimer, the term of this patent is extended or adjusted under 35 U.S.C. 154(b) by 427 days.

(21) Appl. No.: 11/221,717

(22) Filed: Sep. 9, 2005

(65) Prior Publication Data

US 2006/0077227 A1 Apr. 13, 2006

(30) Foreign Application Priority Data

| Sep. 24, 2004 | (JP) | ............................. 2004-277191 |
| Aug. 29, 2005 | (JP) | ............................. 2005-247242 |

(51) Int. Cl.
*B41J 2/14* (2006.01)
(52) U.S. Cl. ........................................................ 347/50
(58) Field of Classification Search .................. 347/50, 347/68
See application file for complete search history.

(56) References Cited

U.S. PATENT DOCUMENTS 6,139,079 A * 10/2000 Patel et al. ................. 294/87.1
6,781,221 B2 * 8/2004 Yoneda ........................ 257/678
2005/0162481 A1 * 7/2005 Furuhata ....................... 347/58

FOREIGN PATENT DOCUMENTS

| JP | 59-139660 A | 8/1984 |
| JP | 01-107549 A | 4/1989 |
| JP | 02-031438 A | 2/1990 |
| JP | 02-042737 A | 2/1990 |
| JP | 05-211200 | 8/1993 |
| JP | 06-151525 | 5/1994 |
| JP | 10-116853 A | 5/1998 |
| JP | 2002-160366 A | 6/2002 |
| JP | 2003-31610 A | 1/2003 |
| JP | 2004-216581 | 8/2004 |

* cited by examiner

*Primary Examiner*—An H Do
(74) *Attorney, Agent, or Firm*—Sughrue Mion, PLLC

(57) ABSTRACT

A bonding structure including bonding wires having a diameter A, bonding pads to which the bonding wires are connected, and bonding portions which, as sites of connection, are arranged on a straight line, and wherein the pitch P of the bonding portions is set at $XA+\sigma$ or more where $1.80 \leq X \leq 2.1$, A is as defined above, and $\sigma$ denotes a variation for the bonding procedure.

6 Claims, 6 Drawing Sheets

BONDING STRUCTURE, ACTUATOR DEVICE AND LIQUID-JET HEAD

BACKGROUND OF THE INVENTION

1. Field of the Invention

This invention relates to a bonding structure involving bonding wires connected to bonding pads. More particularly, the invention relates to the bonding structure which is preferred for application to an actuator device equipped with a vibration plate and a piezoelectric element, especially, for application to a liquid-jet head where a portion of a pressure generating chamber communicating with a nozzle orifice for ejecting ink droplets is constituted of a vibration plate, a piezoelectric element is formed on the surface of the vibration plate, and ink droplets are ejected by displacement of a piezoelectric layer.

2. Description of the Related Art

An actuator device equipped with a piezoelectric element displaced by application of a voltage is installed, for example, on a liquid-jet head for jetting liquid droplets. Known as such a liquid-jet head is, for example, an ink-jet recording head in which a portion of a pressure generating chamber communicating with a nozzle orifice is constituted of a vibration plate, and the vibration plate is deformed by a piezoelectric element to pressurize ink in the pressure generating chamber, thereby ejecting ink droplets from the nozzle orifice. Two types of ink-jet recording heads are put into practical use. One of them is mounted with a piezoelectric actuator device of longitudinal vibration mode which expands and contracts in the axial direction of the piezoelectric element. The other is mounted with a piezoelectric actuator device of flexural vibration mode.

The latter ink-jet recording head adopts a structure in which a drive IC is installed on a plate bonded to a passage-forming substrate having the pressure generating chamber formed therein, for example, a reservoir forming plate, and the drive IC and a terminal portion of a lead electrode leading from each piezoelectric element are electrically connected together by a bonding wire by means of wire bonding (see, for example, Japanese Patent Application Laid-Open No. 2002-160366 (page 3, FIG. 2)). Wire bonding, which is performed in the production of such an ink-jet recording head, is carried out by connecting one end of a bonding wire to a terminal portion of the drive IC with the use of a capillary, and then connecting the other end of the bonding wire to a bonding pad which is a terminal portion of the lead electrode.

With the ink-jet recording head, it is attempted to downsize mounted components, and arrange the vibrators at high density. A high density is also demanded of wiring for a device using a bonding wire. In mounting a bonding wire obliquely, it is preferred to arrange the bonding wire at a large angle in order to downsize the component. From the viewpoint of high density mounting of the vibrators as well, it is preferred to decrease the pitch of the bonding wires for an increased density.

Thus, techniques for applying the bonding wire obliquely to achieve downsizing have hitherto been known (for example, Japanese Patent Application Laid-Open No. 2003-31610 (FIGS. 1, 4 and 5)). The conventional techniques, however, have not defined optimum pitch or angle, and it is desired that the optimal status of arrangement be specified. According to the conventional technologies, moreover, a narrow pitch is achieved by arranging the points of bonding zigzag to prevent contact with the adjacent wire. However, the points of bonding should preferably be arranged on a straight line in consideration of the downsizing of mounted components.

The above-described problems are true of not only liquid-jet heads such as ink-jet recording heads, but also devices having a bonding wire connecting structure using semiconductor elements such as LSI and IC.

SUMMARY OF THE INVENTION

The present invention has been accomplished in the light of the above-mentioned circumstances. It is an object of the invention to provide a bonding structure which defines an optimal arrangement status capable of ensuring high-density wiring for devices using bonding wires.

It is another object of the present invention to provide an actuator device and a liquid-jet head adopting a bonding structure which defines an optimal arrangement status capable of ensuring high-density wiring for devices using bonding wires.

A first aspect of the present invention for attaining the above object is a bonding structure comprising: bonding wires having a diameter A; bonding pads to which the bonding wires are connected; and bonding portions, as sites of connection, arranged on a straight line, and wherein the pitch P of the bonding portions is set at $XA+\sigma$ or more where $1.80 \leq X \leq 2.1$, A is as defined above, and $\sigma$ denotes a variation for a bonding procedure.

In the first aspect, it becomes possible to specify the optimal status of the pitch P of the arranged bonding portions that can impart high density wiring to the devices with the use of the bonding wires.

A second aspect of the present invention is a bonding structure comprising: bonding wires having a diameter A; bonding pads to which the bonding wires are connected; and bonding portions, as sites of connection, arranged on a straight line, and wherein the bonding wires are arranged in an inclined manner at an angle $\theta$ with respect to a direction perpendicular to the direction of arrangement of the bonding portions, and the pitch of the bonding portions is set at $(XA+\theta)/\cos\theta$ or more where $1.80 \leq X \leq 2.1$, A is as defined above, and $\sigma$ denotes a variation for a bonding procedure.

In the second aspect, it becomes possible to specify the optimal status of the pitch P of the arranged bonding portions that can impart high density wiring to the devices with the use of the bonding wires arranged in an inclined manner at the angle $\theta$.

A third aspect of the present invention is a bonding structure comprising: bonding wires having a diameter A; bonding pads to which the bonding wires are connected; and bonding portions, as sites of connection, arranged on a straight line, and wherein the pitch P of the bonding portions is set at $XA+\sigma$ or more where $1.80 \leq X \leq 2.1$, A is as defined above, and $\sigma$ denotes a variation for a bonding procedure, and wherein the bonding wires are arranged in an inclined manner at an angle $\theta$ with respect to a direction perpendicular to the direction of arrangement of the bonding portions, and the angle $\theta$ is rendered smaller than $\cos^{-1}\{(XA+\sigma)/\text{pitch } P\}$ where $1.80 \leq X \leq 2.1$, A is as defined above, and $\sigma$ denotes the variation for the bonding procedure.

In the third aspect, it becomes possible to specify the optimal status of the pitch P of the arranged bonding portions and the optimal angle $\theta$ that can impart high density wiring to the devices with the use of the bonding wires arranged in an inclined manner at the angle $\theta$.

A fourth aspect of the present invention is the bonding structure according to any one of the first to third aspect, characterized in that at least a surface of each of the bonding pads which contacts each of the bonding wires comprises gold.

In the fourth aspect, the bonding pad comprising gold is used, so that the bonding wires comprising gold can be arranged in an optimal configuration, and bonded reliably.

A fifth aspect of the present invention is the bonding structure according to any one of the first to fourth aspects, characterized in that each of the bonding pads is connected to a terminal portion of a drive IC for driving a drive portion of an actuator device.

In the fifth aspect, the bonding wires can be put in an optimal arrangement status with respect to the bonding pads disposed on the drive IC, and bonded reliably.

A sixth aspect of the present invention is the bonding structure according to the fifth aspect, characterized in that each of the bonding wires has one end connected to the terminal portion of the drive IC, and has another end connected to a terminal portion of a lead electrode rearwardly in a direction where the bonding procedure proceeds.

In the sixth aspect, optimal arrangement can be identified in consideration of the shape of the bonding portions provided at the other end.

A seventh aspect of the present invention is an actuator device comprising: a vibration plate provided on a surface of a substrate; a plurality of piezoelectric elements each composed of a lower electrode, a piezoelectric layer, and an upper electrode provided via the vibration plate; a drive IC for driving the piezoelectric elements; and bonding pads connected to a terminal portion of the drive IC, and wherein bonding wires are connected to the bonding pads by the bonding structure of any one of claims 1 to 6.

In the seventh aspect, the actuator device can be provided with a bonding structure having the bonding portions in an optimal arrangement status which can impart high density wiring to the devices with the use of the bonding wires.

An eighth aspect of the present invention is a liquid-jet head comprising: the actuator device of claim 7; and a passage-forming substrate in which pressure generating chambers communicating with nozzle orifices are formed, and on a surface of which the actuator device is provided.

In the eighth aspect, the wiring of the devices using the bonding wires can be laid at high density, the width of the bonding pads can be-narrowed, and the nozzle orifices can be arranged at high density.

BRIEF DESCRIPTION OF THE DRAWINGS

For a more complete understanding of the present invention and the advantages thereof, reference is now made to the following descriptions in conjunction with the accompanying drawings.

DESCRIPTION OF THE PREFERRED EMBODIMENTS

The present invention will now be described in detail based on the embodiments offered below.

Figure 1:
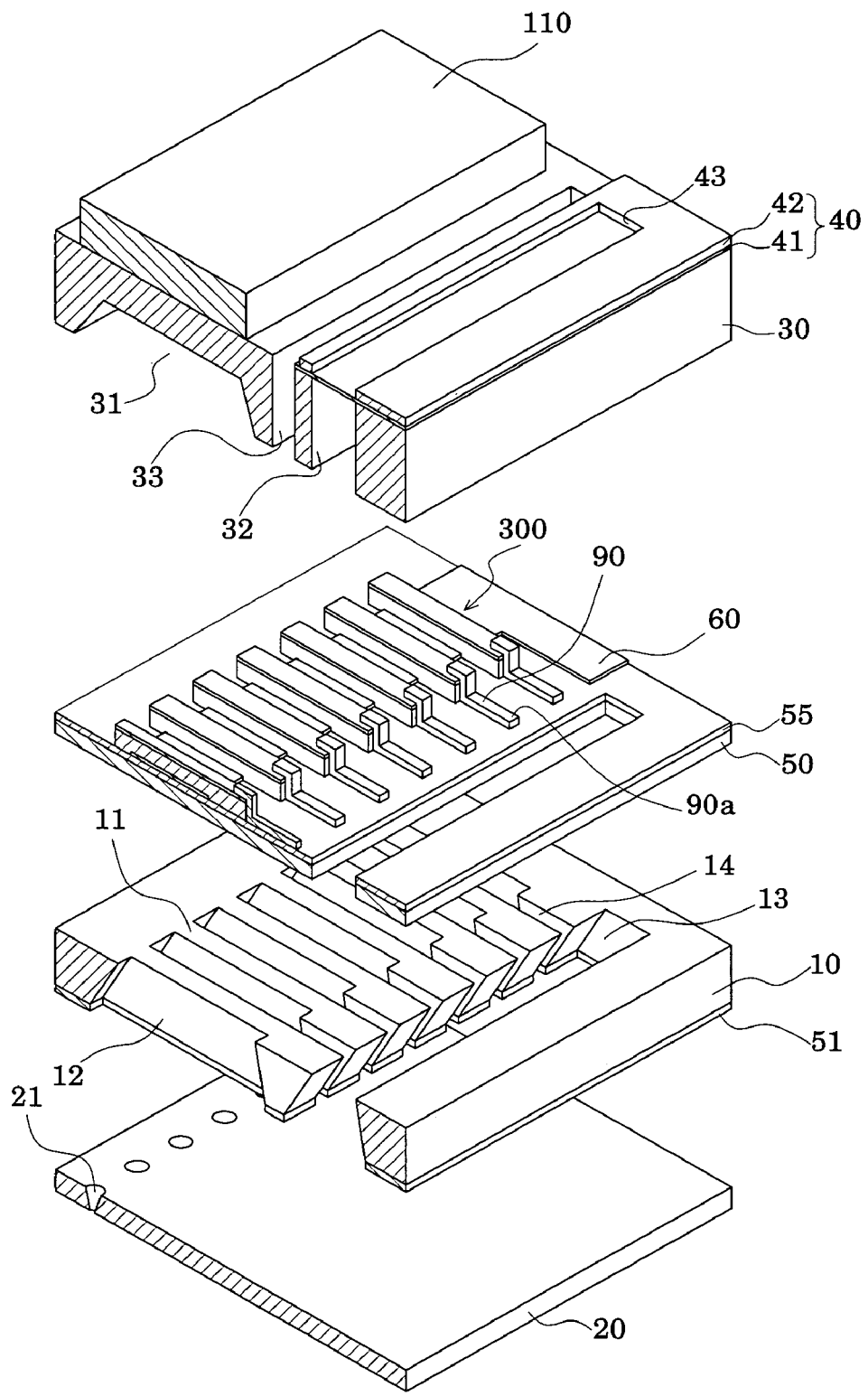
FIG. 1 is an exploded perspective view of a liquid-jet head according to an embodiment of the present invention.
Figure 2A:
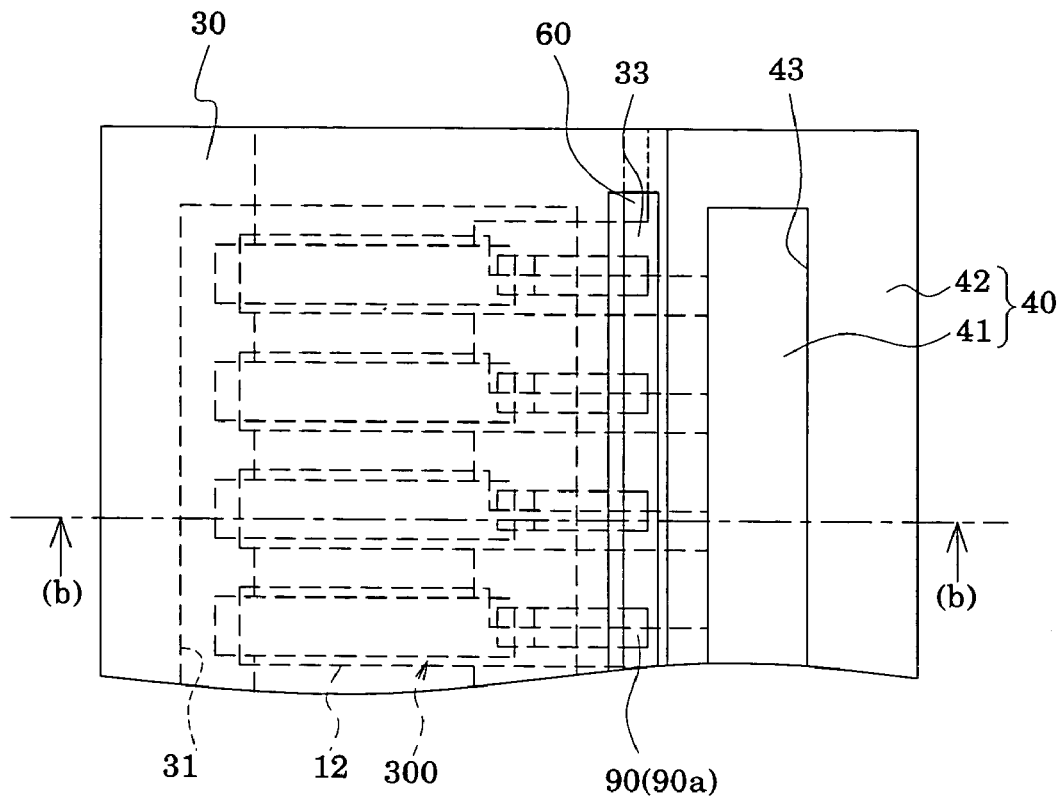
FIGS. 2(a) and 2(b) are, respectively, a plan view and a sectional view of the liquid-jet head according to the embodiment of the present invention.
Figure 2B:
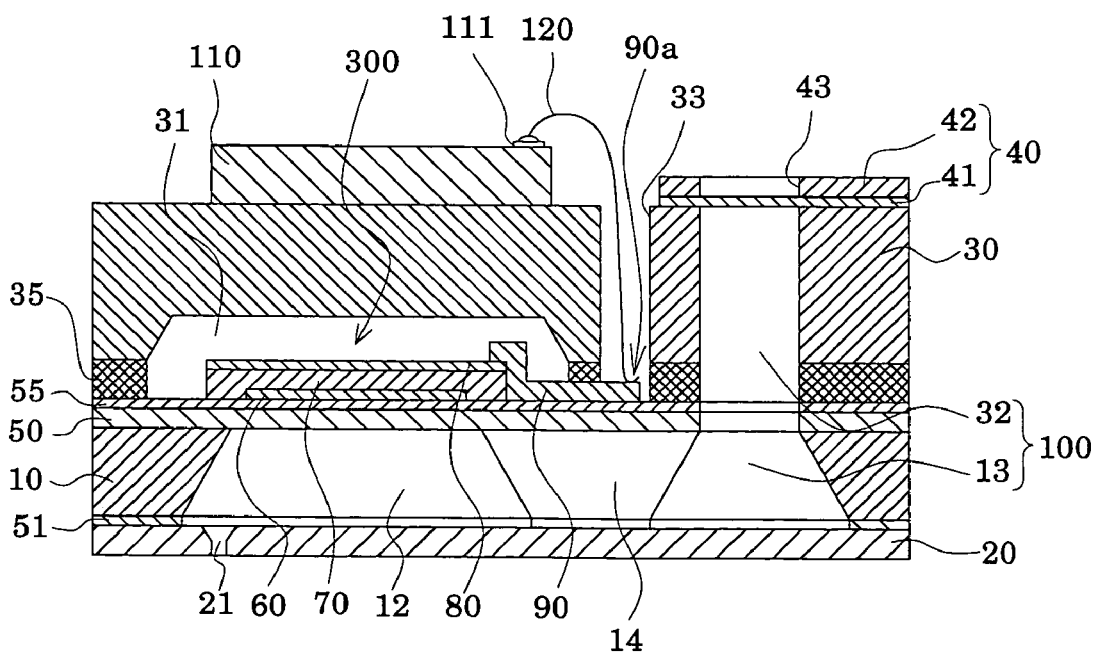

FIG. 1 is an exploded perspective view showing a liquid-jet head according to an embodiment of the present invention. FIG. 2(a) and FIG. 2(b) are a plan view and a sectional view, respectively, of the liquid-jet head in FIG. 1.

A passage-forming substrate 10 constituting the liquid-jet head, in the present-embodiment, consists of a single crystal silicon substrate. An elastic film 50, composed of silicon dioxide formed beforehand by thermal oxidation, is formed on one surface of the passage-forming substrate 10. In the passage-forming substrate 10, pressure generating chambers 12 partitioned by a plurality of compartment walls 11 are formed by anisotropic etching performed from the other surface of the passage-forming substrate 10. Longitudinally outwardly of the pressure generating chambers 12 arranged in a row, a communicating portion 13 is formed which communicates with a reservoir portion 32 provided in a reservoir forming plate 30 (to be described later on) to constitute a reservoir 100 serving as a common liquid chamber for the respective pressure generating chambers 12. The communicating portion 13 is also in communication with one end portion in the longitudinal direction of each pressure generating chamber 12 via a liquid supply path 14. Onto the opening surface of the passage-forming substrate 10, a nozzle plate 20 having nozzle orifices 21 bored therein is secured via an adhesive agent or a heat sealing film. The nozzle orifices 21 communicate with the pressure generating chambers 12 on the side opposite to the liquid supply paths 14. The nozzle plate 20 comprises a glass ceramic, a single crystal silicon substrate, or rustless steel having a thickness of, for example, 0.01 to 1 mm, and a linear expansion coefficient of, for example, 2.5 to 4.5 [$\times 10^{-6}$/°C.] at 300° C. or below.

On the side opposite to the opening surface of the passage-forming substrate 10, the elastic film 50 having a thickness, for example, of about 1.0 µm is formed, as described above. An insulation film 55 having a thickness, for example, of about 0.4 µm is formed on the elastic film 50. On the insulation film 55, a lower electrode film 60 with a thickness, for example, of about 0.2 µm, a piezoelectric layer 70 with a thickness, for example, of about 1.0 µm, and an upper electrode film 80 with a thickness, for example, of about 0.05 µm are formed in a laminated state by a process (to be described later) to constitute a piezoelectric element 300. The piezoelectric element 300 refers to a portion including the lower electrode film 60, the piezoelectric layer 70, and the upper electrode film 80. Generally, one of the electrodes of the piezoelectric element 300 is used as a common electrode, and the other electrode and the piezoelectric layer 70 are constructed for each pressure generating chamber 12 by patterning. A portion, which is composed of any one of the electrodes and the piezoelectric layer 70 that have been patterned, and which undergoes piezoelectric distortion upon application of voltage to both electrodes, is called a piezoelectric active portion. In the present embodiment, the lower electrode film 60 is used as the common electrode for the piezoelectric elements 300, while the upper electrode film 80 is used as an individual electrode of each piezoelectric element 300. However, there is no harm in reversing their usages for the convenience of the drive circuit or wiring. In either case, it follows that the piezoelectric active portion is formed for each pressure generating chamber. Herein, the piezoelectric element 300 and a vibration plate, where displacement occurs by a drive of the piezoelectric element 300, are referred to collectively as a piezoelectric actuator.

In the foregoing example, the lower electrode film 60 of the piezoelectric element 300, the elastic film 50, and the insulation film 55 act as the vibration plate. A lead electrode 90 extends as lead-out wiring led from a site near an end portion in the longitudinal direction of the upper electrode film 80 of the piezoelectric element 300 up to a site near an end portion of the pressure generating chamber 12 of the passage-forming substrate 10. The lead electrode 90 comprises a wiring metal layer, for example, of gold (Au) or aluminum (Al), and an adherent metal layer, for example, of titanium-tungsten (TiW) or nickel-chromium (NiCr) provided on the underside of the gold layer.

A terminal portion 90a, which is a front end portion of the lead electrode 90 and comprises gold, is electrically connected to a drive IC 110 (to be described later on) via a bonding wire 120 through a through-hole 33.

The reservoir forming plate 30, which has the reservoir portion 32 constituting at least a part of the reservoir 100, is bonded via an adhesive agent 35 onto the passage-forming substrate 10 on which the above-described piezoelectric elements 300 have been formed. The reservoir portion 32, in the present embodiment, is formed so as to penetrate the reservoir forming plate 30 in its thickness direction and extend in the width direction of the pressure generating chambers 12. The reservoir portion 32, as described earlier, is brought into communication with the communicating portion 13 of the passage-forming substrate 10 to constitute the reservoir 100 which serves as the common liquid chamber for the respective pressure generating chambers 12.

In a region of the reservoir forming plate 30 opposed to the piezoelectric elements 300, there is provided a piezoelectric element holding portion 31 which has such a space as not to impede the movement of the piezoelectric elements 300. In a region of the reservoir forming plate 30 defined between the reservoir portion 32 and the piezoelectric element holding portion 31, the through-hole 33 is provided which penetrates the reservoir forming plate 30 in its thickness direction. The lead electrode 90, which is the lead-out wiring leading from each piezoelectric element 300, has an end and an adjacent area exposed in the through-hole 33. The material for the reservoir forming plate 30 of such a configuration is, for example, glass, a ceramic material, a metal, or a resin. Preferably, the reservoir forming plate 30 is formed of a material having nearly the same thermal expansion coefficient as that of the passage-forming substrate 10. In the present embodiment, the reservoir forming plate 30 is formed from a single crystal silicon substrate which is the same material as that for the passage-forming substrate 10.

The drive IC 110 for driving each piezoelectric element 300 is provided on the reservoir forming plate 30. One end of the bonding wire 120 is connected to each terminal portion 111 of the drive IC 110 to form a first bonding portion 201. The other end of the bonding wire 120 is connected to the terminal portion 90a of the lead electrode 90, which is a bonding pad, to form a second bonding portion 202 (see FIG. 4 to be described later). The wire diameter of the bonding wire 120 is, for example, 20 μm, and the bonding wire 120 having a wire diameter of 20 μm and comprising gold (Au), for example, is used in the present embodiment.

As shown in FIGS. 1 and 2(a), 2(b), a compliance plate 40 is bonded onto the reservoir forming plate 30. Of a region of the compliance plate 40 opposed to the reservoir 100, a region other than a liquid introduction port 44 defines a flexible portion 43 which is formed to be thin in the thickness direction. The reservoir 100 is sealed with the flexible portion 43. The flexible portion 43 imparts compliance to the interior of the reservoir 100.

A wire bonding structure for connecting the terminal portion 111 of the drive IC 110, as a bonding pad, to the terminal portion 90a of the lead electrode 90 by the bonding wire 120 will be described with reference to FIGS. 3(a), 3(b) to FIG. 5.

Figure 3A:
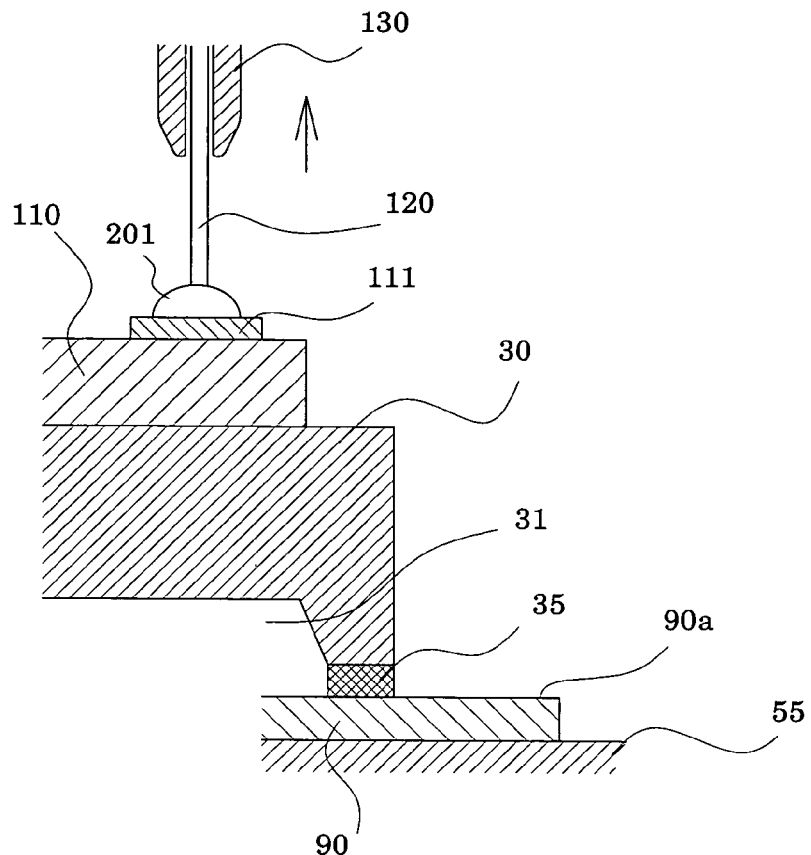
FIGS. 3(a) and 3(b) are sectional views of essential parts showing a wire bonding structure according to the embodiment of the present invention.
Figure 3B:
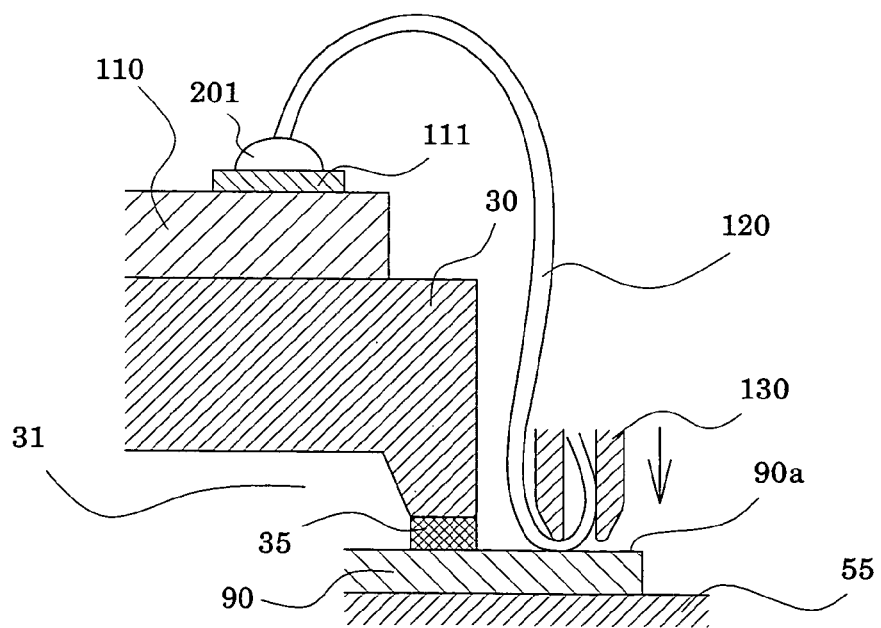
Figure 4:
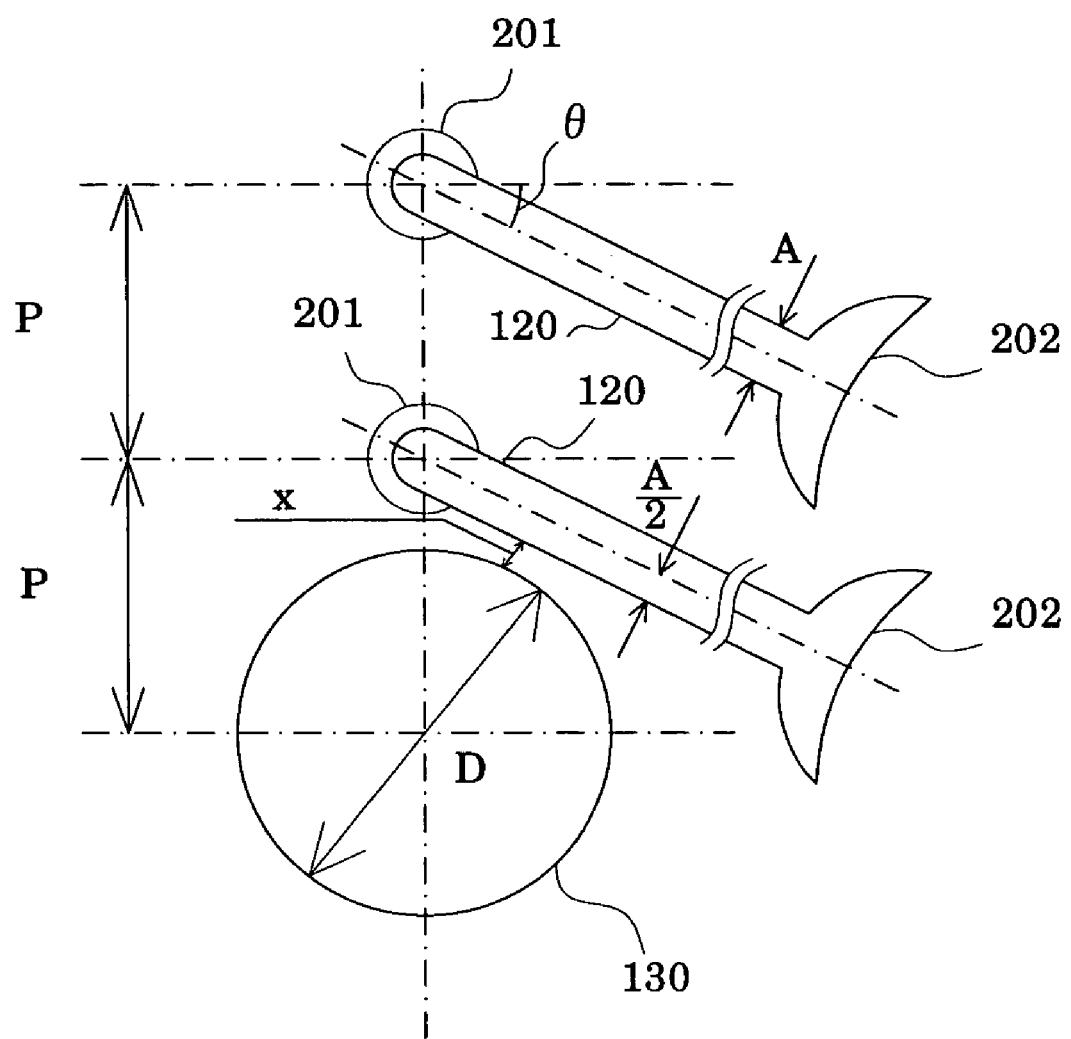
FIG. 4 is a plan view of the essential parts showing the wire bonding structure according to the embodiment of the present invention.
Figure 5:
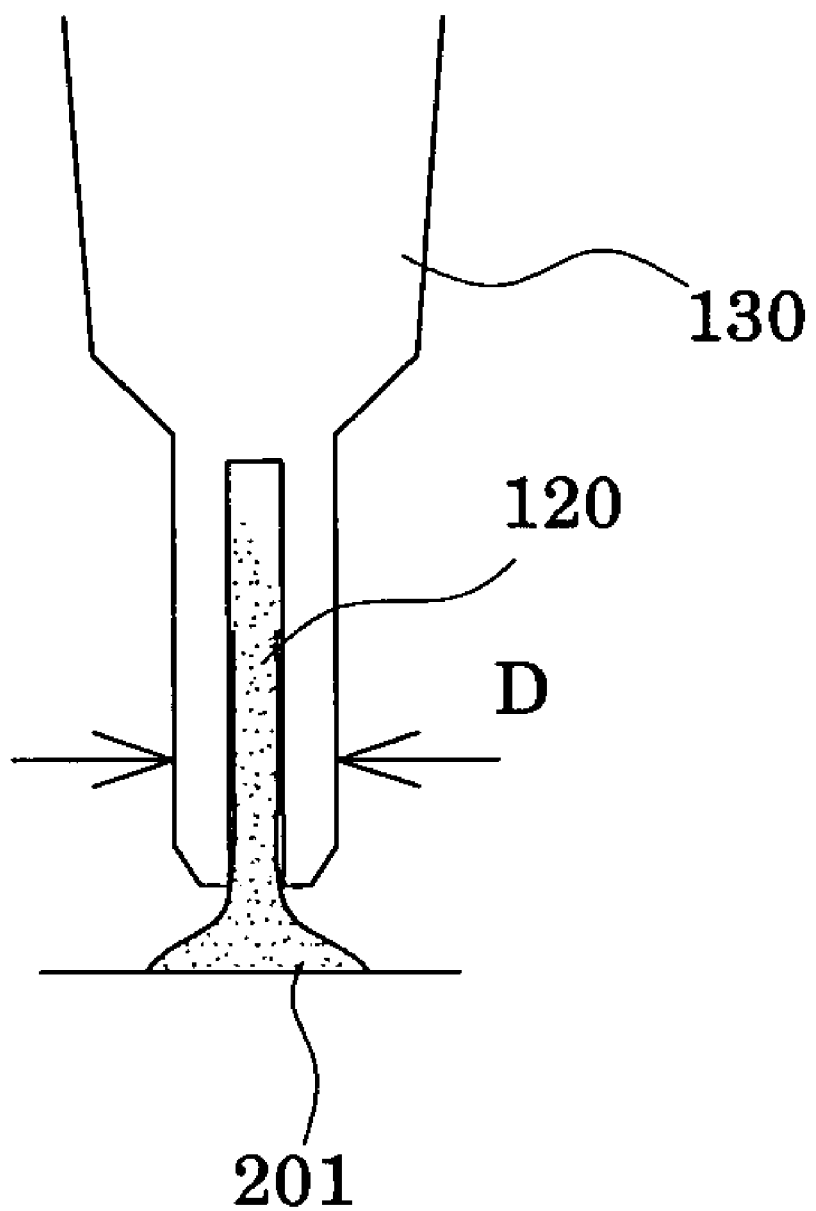
FIG. 5 is a sectional view showing the status of a capillary.

FIGS. 3(a) and 3(b) are sectional views of essential parts showing the wire bonding structure according to the embodiment of the present invention. FIG. 4 is a plan view of the essential parts showing the wire bonding structure according to the embodiment of the present invention. FIG. 5 is a sectional view showing the status of a capillary. The representations of the diameter of the bonding wire 120 and the outer diameter of a capillary 130 in the drawings are provided in a state different from the actual state, in terms of their proportions, etc., for simplified illustration.

As shown in FIG. 3(a), the bonding wire 120 is held by being inserted through the capillary 130 constituting a wire bonding apparatus, and is connected to the terminal portion 111 of the drive IC 110 by ball bonding to form the first bonding portion 201. This connecting method by ball bonding is performed by fusing the front end of the bonding wire 120 to form a ball, and pressing this ball against the terminal portion 111 of the drive IC 110.

Then, as shown in FIG. 3(b), the bonding wire 120 is connected to the terminal portion 90a of the lead electrode 90 which is a bonding pad. At this time, the bonding wire 120 is connected by pressing the bonding wire 120 against the terminal portion 90a of the lead electrode 90 by means of the capillary 130 while heating the bonding wire 120 and applying ultrasonic waves. By this procedure, the second bonding portion 202 (see FIG. 4) having a stitch width is formed.

As shown in FIG. 4, the first bonding portions 201 of the bonding wires 120 having a wire diameter A (for example, 20 μm) are arranged with a predetermined pitch P on a straight line. The first bonding portions 201 are disposed sequentially from above to below in the drawing, i.e., in a bonding proceeding direction, a direction in which the bonding procedure proceeds downward from above in the drawing.

The direction of the second bonding portion 202 (the direction of the bonding wire 120) on the opposite end side of the bonding wire to the first bonding portion 201 is inclined at an angle θ with respect to a direction (i.e., the right-and-left direction in the drawing) perpendicular to the direction of arrangement of the first bonding portions 201 (i.e., the up-and-down direction in the drawing). This direction at the angle θ is rearward (i.e., downward in the drawing) in the bonding proceeding direction. The pitch P and the angle θ are set such that minimum clearance x, which ensures non-contact between the capillary 130 and the bonding wire 120, can be kept.

If the wire diameter A is 20 μm, for example, the feasible outer diameter D of the capillary 130 is in the range of 2.60 A to 3.20 A. If the outer diameter D of the capillary 130 is smaller than 2.60 A, the capillary 130 will be too small with respect to the wire diameter A. This would make it impossible to press the bonding wire 120 against the terminal portion 90a by the capillary 130 while sufficiently heating the bonding wire 120 and applying ultrasonic waves, thereby posing difficulty in forming the second bonding portion 202 having the stitch width. If the outer diameter D of the capillary 130 is larger than 3.20 A, on the other hand, the capillary 130 will be too large with respect to the wire diameter A. This would make it impossible to press the bonding wire 120 against the terminal portion 90a reliably by the capillary 130 while appropriately applying ultrasonic waves, thereby posing difficulty in forming the second bonding portion 202 having the stitch width.

The pitch P of the first bonding portion 201 can be set based on the relation among a distance from a reference position to each of the first bonding portions 201, the value of the cosine of the angle θ, and the clearance x. That is, the pitch P for keeping the clearance x optimal is, from FIG. 4, as follows:

Pitch $P=(1/\cos \theta) \cdot \{x+(A+D)/2\}$

For example, when the capillary 130 having the outer diameter D in the range of 2.65 A to 3.18 A, Pitch $P \times \cos \theta = x + (1.82\text{~}2.09)A$ Provided that the variation for the bonding operation is σ, x−σ>0 means a relation according to which the capillary 130 and the wire 120 adjacent to each other are out of contact. Thus, the following relationship holds:

Pitch $P \times \cos \theta - (1.82\text{~}2.09)A - \sigma = x - \sigma > 0$

In connection with the variation σ, 3σ (99.7%) is of the order of 10 μ. Since 3σ or more has to be considered for availability as a product, it is assumed that σ=10 μ. On this assumption and from Pitch $P \times \cos \theta - (1.82\text{~}2.09)A > \sigma$, Pitch $P \times \cos \theta - (1.82\text{~}2.09)A > 10$ This can be expressed as:

Pitch $P > [\{(1.82\text{~}2.09)A\} + 10]/\cos \theta$

If 0<θ<90, it follows that 0<cos θ<1. Thus, when the wire diameter is A, and the angle is θ, the pitch P is set at $\{(1.82\text{~}2.09)A+10\}$ or less, whereby minimum clearance x, which keeps the capillary 130 and the bonding wire 120 out of contact, can be maintained.

Moreover, when the wire diameter is A, and the angle is θ, the pitch P is set at $\{(1.82\text{~}2.09)A+10\}/\cos \theta$ or more, whereby the minimum clearance x can be maintained.

Furthermore, the angle θ is set to be not larger than $[\cos^{-1}\{(1.82\text{~}2.09)A+10\}/\text{pitch P}]$, whereby the minimum clearance x can be maintained.

Hence, the pitch P of the first bonding portions 201 of the bonding wires 120 with the diameter A is set at XA+σ or more (1.80≦X≦2.1) where σ denotes the variation for the bonding procedure. By so doing, it becomes possible to specify the optimal status of the pitch P of the bonding portions that can impart high density wiring to the devices with the use of the bonding wires 120.

Moreover, the first bonding portions 201 of the bonding wires 120 with the diameter A are arranged on a straight line, the bonding wires 120 are arranged in an inclined manner at the angle θ with respect to a direction perpendicular to the direction of arrangement of the first bonding portions 201, and the pitch P of the first bonding portions 201 is set at (XA+σ)/cos θ or more (1.80≦X≦22.1) where σ denotes the variation for the bonding procedure. By so doing, it becomes possible to specify the optimal status of the pitch P of the arranged first bonding portions 201 that can impart high density wiring to the devices with the use of the bonding wires 120 arranged in an inclined manner at the angle θ.

Furthermore, the first bonding portions 201 of the bonding wires 120 with the diameter A are arranged on a straight line, the pitch P of the first bonding portions 201 is set at XA+σ or more (1.80≦X≦2.1) where σ denotes the variation for the bonding procedure. Also, the bonding wires 120 are arranged in an inclined manner at the angle θ with respect to a direction perpendicular to the direction of arrangement of the first bonding portions 201, and the angle θ is rendered smaller than $\cos^{-1}\{(XA+\sigma)/\text{pitch P}\}$ (1.80≦X≦2.1) where σ denotes the variation for the bonding procedure. By so doing, it becomes possible to specify the optimal status of the pitch P of the arranged first bonding portions 201 and the optimal angle θ that can impart high density wiring to the devices with the use of the bonding wires 120 arranged in an inclined manner at the angle θ.

Figure 6:
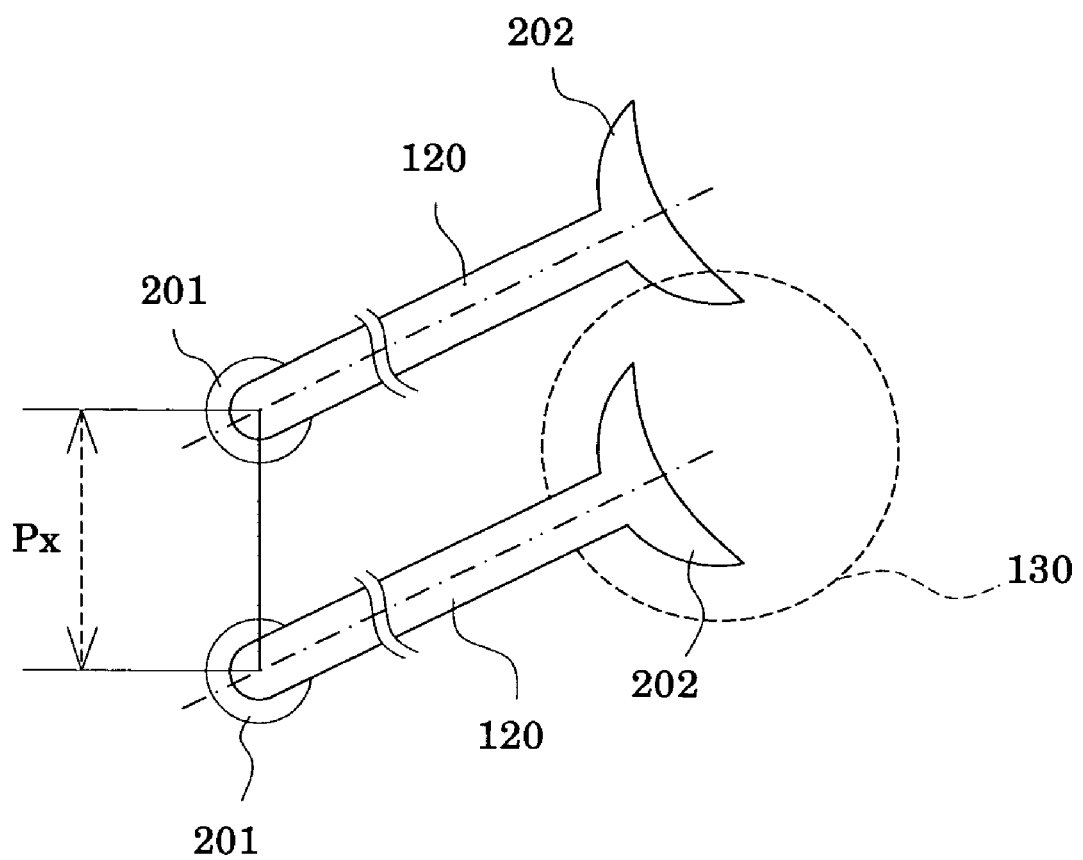
FIG. 6 is a plan view of essential parts showing a wire bonding structure according to another embodiment of the present invention.

As shown in FIG. 6, the direction of the second bonding portion 202 (the direction of the bonding wire 120) may be set to be forward (i.e., upward in the drawing) in the bonding proceeding direction. This obviates the necessity for considering the clearance x between the outer diameter of the capillary 130 and the bonding wire 120, and it suffices to consider only the outer diameter of the capillary 130 with respect to the second bonding portion 202. Thus, even if the pitch Px of the first bonding portion 201 is set at a small value, the capillary 130 does not interfere with the bonding wire 120.

In this case, however, it is necessary to consider the relation between the second bonding portion 202 and the outer diameter of the capillary 130. Since the second bonding portion 202 has a wide stitch zone, the capillary 130 interferes with the stitch zone, if the pitch Px of the first bonding portion 201 is small. Thus, the pitch of the second bonding portion 202 needs to be rendered large. As a result, the pitch Px of the first bonding portion 201 has to be increased, and there is need for a larger pitch Px than the aforementioned pitch P of the first bonding portion 201. Alternatively, an arrangement which avoids interference from the adjacent second bonding portion 202 (for example, a zigzag arrangement, or an arrangement in which the pitch of the arranged second bonding portions 202 is greater than Px) has to be adopted, thereby necessitating a corresponding space.

In order to minimize the pitch P of the first bonding portion 201 with the use of a limited space, it is optimal to set the pitch P of the first bonding portion 201 and the angle θ of inclination of the bonding wire 120 as shown in the present embodiment illustrated in FIG. 4.

In the present embodiment, the terminal portion 111 of the drive IC 110 and the terminal portion 90a of the lead electrode 90 are electrically connected together by the bonding wire 120 connected by the above-described wire bonding structure. The wire bonding method, and the connecting structure for the bonding wire, which have been described above, can be applied to all of the electrodes to be connected by the bonding wires of the liquid-jet head. Examples of the bonding wire other than that for the terminal portion 90a of the lead electrode 90 are a bonding wire for connecting the lower electrode film 60 and the drive IC 110, and a bonding wire for connecting a terminal portion of a wiring electrode, which is formed on the surface of the reservoir forming plate 30 bearing the drive IC 110, to the terminal portion of the drive IC 110, although such bonding wires are not shown.

The present embodiment illustrates the wire bonding method used on the actuator device, especially, the liquid-jet head, and the connecting structure for the bonding wire that has been formed by this method. However, the present invention is not limited to them, and can be applied to other devices using a bonding wire, such as semiconductor devices. It should be understood that such changes, substitutions and alterations can be made therein without departing from the spirit and scope of the invention as defined by the appended claims.

What is claimed is:

1. A bonding structure comprising:
   bonding wires having a diameter A;

bonding pads to which the bonding wires are connected; and bonding portions, as sites of connection, arranged on a straight line, and wherein the bonding wires are arranged in an inclined manner at an angle θ with respect to a direction perpendicular to a direction of arrangement of the bonding portions, and a pitch of the bonding portions is set at (XA+σ)/cos θ or more where $1.80 \leq X \leq 2.1$, A is as defined above, and σ denotes a variation for a bonding procedure.

2. The bonding structure according to claim 1, wherein at least a surface of each of the bonding pads which contacts each of the bonding wires comprises gold.

3. The bonding structure according to claim 2, wherein each of the bonding pads is connected to a terminal portion of a drive IC for driving a drive portion of an actuator device.

4. The bonding structure according to claim 3, wherein each of the bonding wires has one end connected to the terminal portion of the drive IC, and has another end connected to a terminal portion of a lead electrode rearwardly in a direction where the bonding procedure proceeds.

5. An actuator device comprising:
a vibration plate provided on a surface of a substrate;
a plurality of piezoelectric elements each composed of a lower electrode, a piezoelectric layer, and an upper electrode provided via the vibration plate;
a drive IC for driving the piezoelectric elements; and
bonding pads connected to a terminal portion of the drive IC, and
wherein bonding wires are connected to the bonding pads by a bonding structure, and
wherein the bonding structure comprises:
the bonding wires having a diameter A;
the bonding pads to which the bonding wires are connected; and
bonding portions, as sites of connection, arranged on a straight line, and
wherein the bonding wires are arranged in an inclined manner at an angle θ with respect to a direction perpendicular to a direction of arrangement of the bonding portions, and a pitch of the bonding portions is set at (XA+σ)/cos θ or more where $1.80 \leq X \leq 2.1$, A is as defined above, and σ denotes a variation for a bonding procedure,
wherein at least a surface of each of the bonding pads which contacts each of the bonding wires comprises gold,
wherein each of the bonding pads is connected to a terminal portion of a drive IC for driving a drive portion of an actuator device, and
wherein each of the bonding wires has one end connected to the terminal portion of the drive IC, and has another end connected to a terminal portion of a lead electrode rearwardly in a direction where the bonding procedure proceeds.

6. A liquid-jet head comprising:
an actuator device; and
a passage-forming substrate in which pressure generating chambers communicating with nozzle orifices are formed, and on a surface of which the actuator device is provided,
wherein the actuator device comprises:
a vibration plate provided on a surface of a substrate;
a plurality of piezoelectric elements each composed of a lower electrode, a piezoelectric layer, and an upper electrode provided via the vibration plate;
a drive IC for driving the piezoelectric elements; and
bonding pads connected to a terminal portion of the drive IC, and
wherein bonding wires are connected to the bonding pads by a bonding structure comprising:
the bonding wires having a diameter A;
the bonding pads to which the bonding wires are connected; and
bonding portions, as sites of connection, arranged on a straight line, and
wherein the bonding wires are arranged in an inclined manner at an angle θ with respect to a direction perpendicular to a direction of arrangement of the bonding portions, and a pitch of the bonding portions is set at (XA+σ)/cos θ or more where $1.80 \leq X \leq 2.1$, A is as defined above, and σ denotes a variation for a bonding procedure,
wherein at least a surface of each of the bonding pads which contacts each of the bonding wires comprises gold,
wherein each of the bonding pads is connected to a terminal portion of a drive IC for driving a drive portion of an actuator device, and
wherein each of the bonding wires has one end connected to the terminal portion of the drive IC, and has another end connected to a terminal portion of a lead electrode rearwardly in a direction where the bonding procedure proceeds.

* * * * *